United States Patent [19]

Fech, Jr. et al.

[11] 3,940,507

[45] Feb. 24, 1976

[54] ELECTRON BEAM RECORDING MEDIA AND METHOD OF RECORDING

[75] Inventors: John Fech, Jr., Monmouth Junction; Eugene Samuel Poliniak, Willingboro, both of N.J.

[73] Assignee: RCA Corporation, New York, N.Y.

[22] Filed: Oct. 24, 1974

[21] Appl. No.: 517,655

Related U.S. Application Data

[63] Continuation-in-part of Ser. No. 448,825, May 3, 1974, abandoned.

[52] U.S. Cl. .................. 427/43; 96/35.1; 96/67; 96/115; 204/159.14; 204/159.18; 204/159.21; 427/44

[51] Int. Cl.² .......................................... G03C 1/68

[58] Field of Search .................. 96/115 R, 35.1, 67; 204/159.14, 159.18, 159.21; 117/93.31, 93.31 NV, 93.31 ER; 427/43, 44

[56] References Cited

OTHER PUBLICATIONS

Aso, C. et al., *J. of Polymer Science,* Part A–1, Vol. 7, pp. 497–511, 1969.

*Primary Examiner*—Ronald H. Smith
*Attorney, Agent, or Firm*—Glenn H. Bruestle; Birgit E. Morris

[57] ABSTRACT

Recording media comprising films of a polydialdehyde are suitable for recording information with electron beams.

12 Claims, 3 Drawing Figures

ELECTRON BEAM RECORDING MEDIA AND METHOD OF RECORDING

This application is a continuation-in-part of application Ser. No. 448,825, filed May 3, 1974, now abandoned.

This invention relates to novel electron beam recording media. More particularly, this invention relates to recording media for recording information with an electron beam, which media have excellent resolution and sensitivity.

BACKGROUND OF THE INVENTION

Information recorded in the form of a relief pattern has long been known using photoresists as the recording media. Such media, when exposed to a light pattern, change their solubility characteristics in the area struck by the light. Recently, suitably modulated electron beams have also been utilized for recording relief patterns. Some photoresists are useful as electron beam resists, but most of them are relatively insensitive to electrom beams, and recording must be performed at slow rates, slower than presently available equipment will permit.

Several polymeric materials are known to be electron beam sensitive, including polymethylmethacrylate, copolymers of certain olefins and $SO_2$, disclosed by Kaplan and Davidson in copending application Ser. No. 401,213 filed Sept. 27, 1973, now U.S. Pat. No. 3,893,127 and certain alpha, beta-unsaturated ketone polymers, disclosed by Levine and Kaplan in copending application Ser. No. 314,975 filed Dec. 14, 1972. However, the search for additional materials that are particularly sensitive to electron beams and are capable of providing well resolved relief patterns has been continued.

SUMMARY OF THE INVENTION

We have found that films of polydialdehydes are excellent electron beam resists having high sensitivity. These media do not form volatile decomposition products during recording.

DETAILED DESCRIPTION OF THE INVENTION

Figure 1:
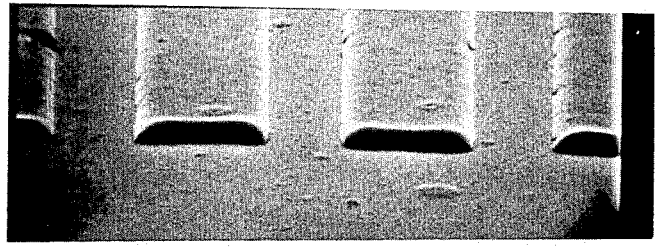
FIGS. 1 and 3 are electronmicrographs of developed information patterns in recording media described herein.

Polymers found useful as electron beam resists are homopolymers of dialdehydes having recurring units of the formula

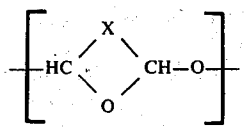

wherein X can be a straight or branched chain alkylene group having 1–10 carbon atoms or a saturated or unsaturated cycloalkylene or arylene group having up to 10 carbon atoms. The polymers can be acetylated for increased stability.

The above polymers are known and can be prepared by the polymerization of a dialdehyde in the cold in the presence of various catalysts. A solvent such as methylene chloride, toluene, tetrahydrofuran, and the like is generally also present. Suitable catalysts include ionic catalysts such as lithium t-butyrate, boron trifluoroetherate, triphenylmethylfluoroborate, triethylaluminum/water, Friedel Crafts catalysts, and the like, and coordination catalysts such as aluminum triethyl titanium tetrachloride, aluminum triethyl trichlorovanadate and the like. Polymerization by gamma-ray irradiation has also been reported. The monomer is reacted for some time, usually an hour or more, and then the reaction is quenched, as with pyridine. The resultant polymer can be precipitated from a suitable nonsolvent.

After polymerization, the polymer can be stabilized by terminating with acetate groups by reacting with acetic anhydride at slightly elevated temperatures. Reaction is continued until the terminal hydroxyl groups are acetylized and the resultant terminated polymer is precipitated, washed and dried. The terminated polymers are stable enough for long term storage.

In preparing the recording media of the invention, the purified polymer is solution cast or spun onto a support if desired. The nature of this support is conventional; suitable supports can be flexible, such as polyester tape, or inflexible such as glass plate; transparent or opaque, depending on the nature of the recording system in which it is to be employed. The concentration of the polymer in the solvent, which can be for example cellosolve acetate, is adjusted so as to deposit a film of the desired thickness onto the support. The solvent is then removed in any conventional manner, as by drying, evaporating, and the like.

An electrically conductive layer is also desirable to remove the charge after electron beam exposure. In the event that the support is nonconducting, a thin conductive film is applied either to the support prior to coating with the resist, or, applied onto the surface of the prepared recording medium. This conductive film can be coated glass, such as tin oxide or indium oxide coated glass, glass having a conductive metal film such as of nickel, and the like. Alternatively, an electron permeable conductive layer can be formed on the polymer film by vapor deposition of a thin film of copper, nickel, aluminum, chromium or other conductive metal or alloy in known manner. The conductive layer is suitably from about 50–10,000, preferably 100–1000 angstroms in thickness.

The recording medium is ready for exposure to electron beam recording. A variable speed scanning electron microscope is employed in known manner to record desired information in the polymer film.

After recording, the recording medium is developed by immersing in or spraying with a suitable solvent or solvent mixture. Suitable developer solvents include esters such as cellosolve acetate, propyl acetate, pentyl acetate, isopentyl acetate, t-butyl acetate, ethyl acetate, methyl acetate, cyclohexyl acetate, methyl cellosolve, butyl cellosolve, and the like; ketones such as acetone, methylethyl ketone, and the like; hydrocarbons such as hexane, toluene and the like; alcohols such as methanol, ethanol, isopropanol, hexanol, decanol, 2-ethyl-1-butanol, 2-ethyl-1-hexanol, 1,5-hexanediol, octanol-1, octanol-2, cyclohexanol, 3-methylcyclohexanol, 4-methylcyclohexanol, carbitol and the like; and aqueous solutions such as hexane/water, aqueous sodium bisulfite and the like. In general films about 350 millimicrons thick are deposited on the support and development is carried out until about 50 to 60 millimicrons of unexposed polymer are dissolved.

Optimum solvents for each polymer and development time for each solvent can be readily determined by a series of test runs by one skilled in the art. In general, polymers having a cyclic alkylene or arylene group will be best developable with cyclic solvents. Aldehydes having fewer carbon atoms per recurring unit are more soluble and thus more sensitive to developer solvents. They can best be developed by solvent-nonsolvent mixtures.

The invention will be further illustrated by the following examples, but it is to be understood that the invention is not meant to be limited to the details described therein.

EXAMPLE 1

Part A: Preparation of Polymer 13.4 Grams (0.1 mol) of phthalaldehyde was polymerized in 134 mls of methylene chloride at −78°C. using 0.076 ml (0.06 mol) of boron trifluoroetherate as catalyst. After reacting for one hour, the solution was quenched with 0.5 ml of pyridine. The polymer was precipitated with 800 mls of diethyl ether, filtered, washed with 500 mls of ether and vacuum dried at room temperature.

The polymer was obtained in 92.5% yield and had a melting point of 123°–123.5°C. The structure was confirmed by nuclear magnetic resonance spectroscopy.

The polymer product was reprecipitated from methylene chloride with methanol, filtered and dried. A yield of 82% was obtained of the polymer now having a melting point of 142°–143°C.

Part B: Termination of Polymer

Three grams of polymer product obtained as in Part A were reacted with 60 mls of acetic anhydride at 35°C. for 3 days. The solution was poured into ice water, the precipitated polymer filtered, washed with water, then methanol, and dried under vacuum.

The polymer product was purified by dissolving in 50 mls of tetrahydrofuran, reprecipitated with 800 mls of methanol, filtered and dried.

A yield of about 70% of a polymer having the structure

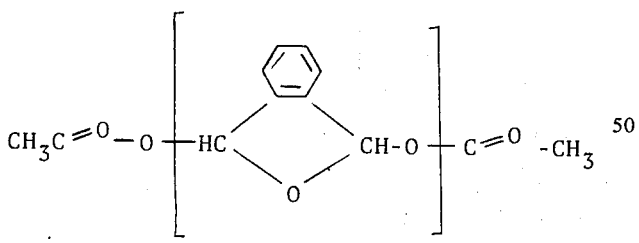

was obtained having a melting point of 162.5°–164°C. The number average molecular weight of the polymer was 48,000 and the weight average molecular weight was 71,600.

Part C: Electron Beam Recording

A solution containing 1 part of the polymer in 9 parts of cellosolve acetate was made and spun coated onto nickel coated glass plates fitted with silver paste electrodes. The film thickness was about 300 nanometers. The films were given line exposures to the beam of a scanning electron microscope at an accelerating potential of 5 kV and a beam current of 3 nA. The gaussian-shaped beam, having a width at ½ amplitude of 0.42 micron, was scanned at several speeds to describe rasters on the surface of the films, thereby varying the total exposure of the films to the beam.

The exposed films were developed by immersing in a 65:35 mixture of cyclohexylacetate and butyl cellosolve for two minutes and 15 seconds. After drying, the films were measured for erosion of the unexposed area; about 60 nanometers of erosion had occurred.

A layer of gold about 200 angstroms thick was evaporated onto the developed films which were then examined using a scanning electron microscope. The width and depth of the raster lines were measured. The data are summarized below:

| SAMPLE | ELECTRON BEAM VELOCITY, CM/SEC. | EXPOSURE M COULOMBS/ $CM^2$ | LINE WIDTHS, MICRONS |
|---|---|---|---|
| 1 | 2.5 | 26 | 1 |
| 2 | 10 | 6.7 | 0.925 |
| 3 | 25 | 2.6 | 0.6 |

Figure 2:
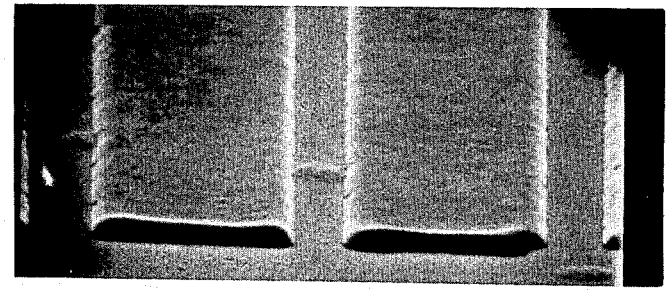
Figure 3:
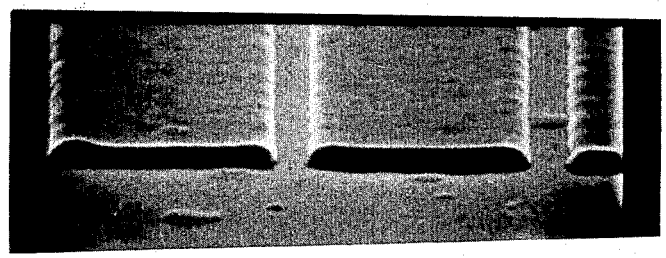

The Figures show photomicrographs of the above samples wherein FIG. 1 is a photomicrograph of sample 1, FIG. 2 is a photomicrograph of sample 2, and FIG. 3 is a photomicrograph of sample 3. It can be seen that the trenches have an excellent geometry, that is, a clearly defined, straight walled trench.

Example 2

Polysuccinaldehyde was polymerized according to the method described by C. Aso et al., *Die Makromolekular Chemie*, 84, 126–136 (1965). A solution of 4.3 grams of succinaldehyde (0.05 mol) in 80 mls of dry toluene was added to a dry polymerization tube and cooled to −78°C. in a dry ice-acetone bath. 0.05 Mol of water and 0.335 gram (0.0029 mol) of triethylaluminum were added and the reaction was continued for 18 hours when it was quenched with 0.5 ml of pyridine. The polymer product was precipitated twice from solution in toluene with 80 mls of hexane. The polymer was then dissolved in benzene, filtered to remove gel particles, precipitated with hexane and dried at room temperature under vacuum.

The resultant polymer had the structure

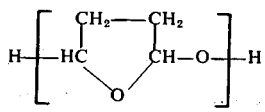

a fusion temperature of 75°–80°C. and a melting point of 105°–110°C. It remained stable in benzene solution.

A film was cast from cellosolve acetate solution onto nickel coated glass plates and exposed to an electron beam as in Part C of Example 1. The films were developed from hexane/water (50% by volume). Good raster lines were observed using a scanning electron microscope.

EXAMPLE 3

Polyglutaraldehyde was polymerized according to the method described by C. Aso et al., *Die Makromolekulare Chemie* 58, 195 (1962). Ten grams of glutaraldehyde were dissolved in 200 mls of toluene and cooled to −78°C. in a polymerization tube. A catalyst (0.63 ml of boron trifluoroetherate) was added and reaction was continued for 1.5 hours when it was quenched with 1 ml of pyridine. The polymer was precipitated with hexane. A yield of 24% was obtained.

The polymer was purified by precipitating from benzene once and from tetrahydrofuran twice and drying under vacuum. 3.5 Grams of polymer were obtained.

The polymer was dissolved in 40 ml of benzene containing 30 mls of acetic anhydride and 6 mls of pyridine and stirred for 18 hours at 30°C., 3 hours at 40°C. and warmed to 90°C. before pouring into hexane. The polymer was purified by precipitating from tetrahydrofuran three times and vacuum drying.

A 71% yield (2.5 grams) of a polymer of the formula $$CH_3C(=O)-O-[-HC(CH_2-CH_2-O-CH_2)CH-O-]-C(=O)-CH_3$$

was obtained.

This polymer had a melting point of 115°–120°C., a number average molecular weight of 4270, a weight average molecular weight of 6150 and a dispersivity of 1.44.

A film was cast from tetrahydrofuran onto nickel coated glass plates and exposed to an electron beam as in Part C of Example 1. The films were developed from cyclohexanol. Good raster lines were observed under a scanning electron microscope.

We claim:

1. A medium for electron beam recording which comprises a film of a polymer having the formula $$R-[HC(X/O\backslash)CH-O]-R'$$

wherein R is H or $$CH_3C(=O)-O-$$

and R' is H or $$-C(=O)-CH_3$$

and X is selected from the group consisting of branched or straight chain alkylene groups of 1 – 10 carbon atoms, saturated or unsaturated cycloalkylene groups and arylene groups of up to 10 carbon atoms and an electrically conductive layer on a support.

2. A medium according to claim 1 wherein the polymer layer is about 350 millimicrons thick and the conductive layer is about 50–10,000 angstroms thick.

3. A medium according to claim 1 wherein the polymer is terminated by acetate groups.

4. A medium according to claim 1 wherein X is o-phenylene.

5. A medium according to claim 4 wherein the polymer is terminated by acetate groups.

6. A medium according to claim 1 wherin X is alkylene.

7. A medium according to claim 6 wherein X is ethylene.

8. A medium according to claim 6 wherein X is propylene.

9. A medium according to claim 8 wherein the polymer is terminated by acetate groups.

10. A medium according to claim 1 wherein said electrically conducting layer is adjacent to the support.

11. In the method of recording information whereby a modulated beam of electrons is scanned across the surface of a resist material which becomes more soluble in a developer solvent when impinged upon by a beam of electrons and the resist material is developed with a developer solvent so as to move the solubilized portion thereof, the improvement which comprises employing as the resist material a film of a polymer having the formula $$R-[HC(X/O\backslash)CH-O]-R'$$

wherein R is H or $$CH_3C(=O)-O-$$

and R' is H or $$-C(=O)-CH_3$$

and X is selected from the group consisting of branched or straight chain alkylene groups of 1 – 10 carbon atoms, saturated or unsaturated cycloalkylene groups and arylene groups of up to 10 carbon atoms and an electrically conductive layer on a support.

12. The method according to claim 11 wherein said electrically conducting layer is adjacent to the support.

* * * * *